United States Patent
Kitade et al.

(12) 
(10) Patent No.: US 6,314,035 B1
(45) Date of Patent: Nov. 6, 2001

(54) SEMICONDUCTOR MEMORY DEVICE CAPABLE OF MANIFESTING A SHORT-CIRCUIT FAILURE ASSOCIATED WITH COLUMN SELECT LINE

(75) Inventors: Osamu Kitade; Tetsushi Hoshita, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/615,954

(22) Filed: Jul. 13, 2000

(30) Foreign Application Priority Data

Jul. 19, 1999 (JP) .................................... 11-204658

(51) Int. Cl.$^7$ ...................................... G11C 7/00
(52) U.S. Cl. ................... 365/201; 365/200; 365/230.03; 365/230.06
(58) Field of Search .................................... 365/201, 200, 365/230.06, 230.03

(56) References Cited

U.S. PATENT DOCUMENTS 5,424,990 * 6/1995 Ohsawa ................................ 365/201
6,094,388 * 7/2000 Cowles ................................ 365/201

FOREIGN PATENT DOCUMENTS 5-291368 11/1993 (JP) .

* cited by examiner

*Primary Examiner*—Huan Hoang
(74) *Attorney, Agent, or Firm*—McDermott, Will & Emery

(57) ABSTRACT

In a semiconductor memory device a column decoder outputs column select signals which are in turn transmitted to a memory cell block via a transfer gate which turns on when a signal fed through a WBI pad is placed in the inactive state. Even-numbered column select lines are connected via a transfer gate to an even-numbered CSL pad, and odd-numbered column select lines are connected via the transfer gate to an odd-numbered CSL pad.

9 Claims, 14 Drawing Sheets

SEMICONDUCTOR MEMORY DEVICE CAPABLE OF MANIFESTING A SHORT-CIRCUIT FAILURE ASSOCIATED WITH COLUMN SELECT LINE

BACKGROUND OF THE INVENTION

1. Field of the Invention

The present invention relates to semiconductor memory devices and particularly to their configurations rapidly running a test for improving their reliability.

2. Description of the Background Art

As semiconductor memory devices such as dynamic random access memories (DRAMs) are being increased in memory capacity, the time required for testing such devices is also increased significantly.

This is because as a semiconductor memory device is increased in memory capacity it is also increased in the number of word lines and it thus disadvantageously takes a lot longer time to write and read information to and from memory cells as such word lines are successively placed in a selected state.

This problem becomes severe in an acceleration test such as a burn-in test, which is a total inspection. In the burn-in test, semiconductor memory devices are operated at a high temperature and on a high voltage to manifest various latent initial detects, such as a defective gate insulating film of a constituent MOS transistor, a defective interlayer insulating film between interconnections, a defective interconnection, or a defect attributed to a particle introduced during the device manufacturing process, to eliminate any defective products before the devices are shipped.

Generally, a semiconductor memory device can have a failure mainly in the following three periods: initial failure period, accidental failure period, and wear-out failure period, as arranged in chronological order.

The initial failure period is a period in which a semiconductor device presents as a failure a defect introduced into the device when the device is being manufactured, and it is thus a period in which a failure occurs initially, soon after a semiconductor device is brought into use. The initial failure rate rapidly decreases with time. Thereafter, a low failure rate continues for a long period of time in the accidental failure period. The device then approaches the end of its longevity and thus enters the wear-out failure period, in which its failure rate rapidly increases.

Desirably, a semiconductor device should be used in the accidental failure period. To provide more reliable semiconductor memory devices, any devices which will have an initial failure should be eliminated previously. To do so, semiconductor memory devices are accelerated in operation for a predetermined period of time and thus aged and thus screened to remove any defective products. To screen the devices effectively in a short period of time, it is desirable that a test be conducted allowing a device to have an initial failure rate rapidly decreasing with time and thus enter the accidental failure period as soon as possible.

Currently, semiconductor memory devices can be subjected to a high-temperature operation test such as described above, or a burn-in test, when they are screened. The test is conducted on an actual device to directly estimate the reliability of the gate oxide film of the MOS transistor, operating the device in a high electric field and at a high temperature and thus applying a stress thereto to manifest various defective factors including migration of aluminum interconnection.

As such, such burn-in test as described above is essential in shipping products of high quality and if the test requires longer time then it will directly increase the cost for manufacturing semiconductor memory devices.

A conventional burn-in test is conducted on semiconductor memory devices for example mold-packaged and thus completely assembled. If in such burn-in test any semiconductor memory device is found to have an initial failure then such device may be not shipped as a final product. This means that the chip has been assembled in vain.

To save such a wasteful fabrication cost, a burn-in test (a WBI test hereinafter) can be conducted on a semiconductor memory device in the form of a wafer.

In conducting such WBI test on a semiconductor memory device, its circuit configuration is subjected to a high-temperature acceleration test in two burn-in modes of operation, i.e., a memory-cell burn-in mode and a peripheral-circuitry burn-in mode.

When there are such two modes, in a decode signal unit an interconnection receives a stress in the peripheral circuitry burn-in mode.

In the peripheral circuitry burn-in mode of operation, oftentimes with a DRAM in a self-refresh operation the peripheral circuitry is burn-in operated for example with an external power supply voltage applied as a power supply potential. More specifically, in burn-in testing a semiconductor memory device in the form of a wafer, when the device in a standby state externally receives a potential of a power supply voltage Vcc level externally via a pad exclusively used for a wafer burn-in test (a WBI pad), in the DRAM a test mode detection circuit detects that a wafer burn-in test mode has been set and responsively a stress is applied between word lines.

In such an operation as described above, in a row-related circuit on a path for transmitting a decoded signal there will be a stress applied thereto, although low in duty ratio.

In a column-related circuit, however, a decoded signal is not activated in the self refresh operation, with a disadvantageous result that any stress cannot be applied to a column-related path for transmitting decoded signals, such as a column select line (a CSL line hereinafter).

As a result, if a chip in the form of a wafer is subjected to a burn-in test and determined as being free of any defects it might be a defective product if it is subjected to a burn-in test after it has been assembled and thus complete. Such is not preferable in conducting a burn-in test on a wafer to ensure the reliability of each chip.

SUMMARY OF THE INVENTION

The present invention contemplates a semiconductor memory device capable of applying a stress voltage to a column select line and capable of manifesting a short-circuit failure associated with the column select line.

Briefly speaking, the present invention is a semiconductor device including a memory cell array, a row selected circuit, a plurality of column select lines, a column select circuit, a data input/output circuit, and a stress application circuit.

The memory cell array includes a plurality of memory cells arranged in rows and columns. The row select circuit is responsive to a row address signal for selecting a row of the memory cell array.

The plurality of column select lines selects a column of the memory cell array. The column select circuit is responsive to a column address signal for generating a signal for selectively activating at least one of the plurality of column select lines.

The data input/output circuit transmits and receives data to and from a memory cell column corresponding to an activated one of the plurality of column select lines.

The stress application circuit selectively applies a stress potential to a predetermined one of the plurality of column select lines in a test mode.

Thus a main advantage of the present invention is that in a test period a stress potential can be selectively applied to a predetermined one of a plurality of column select lines to manifest an initial failure and thus screen any defective chips having such failure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
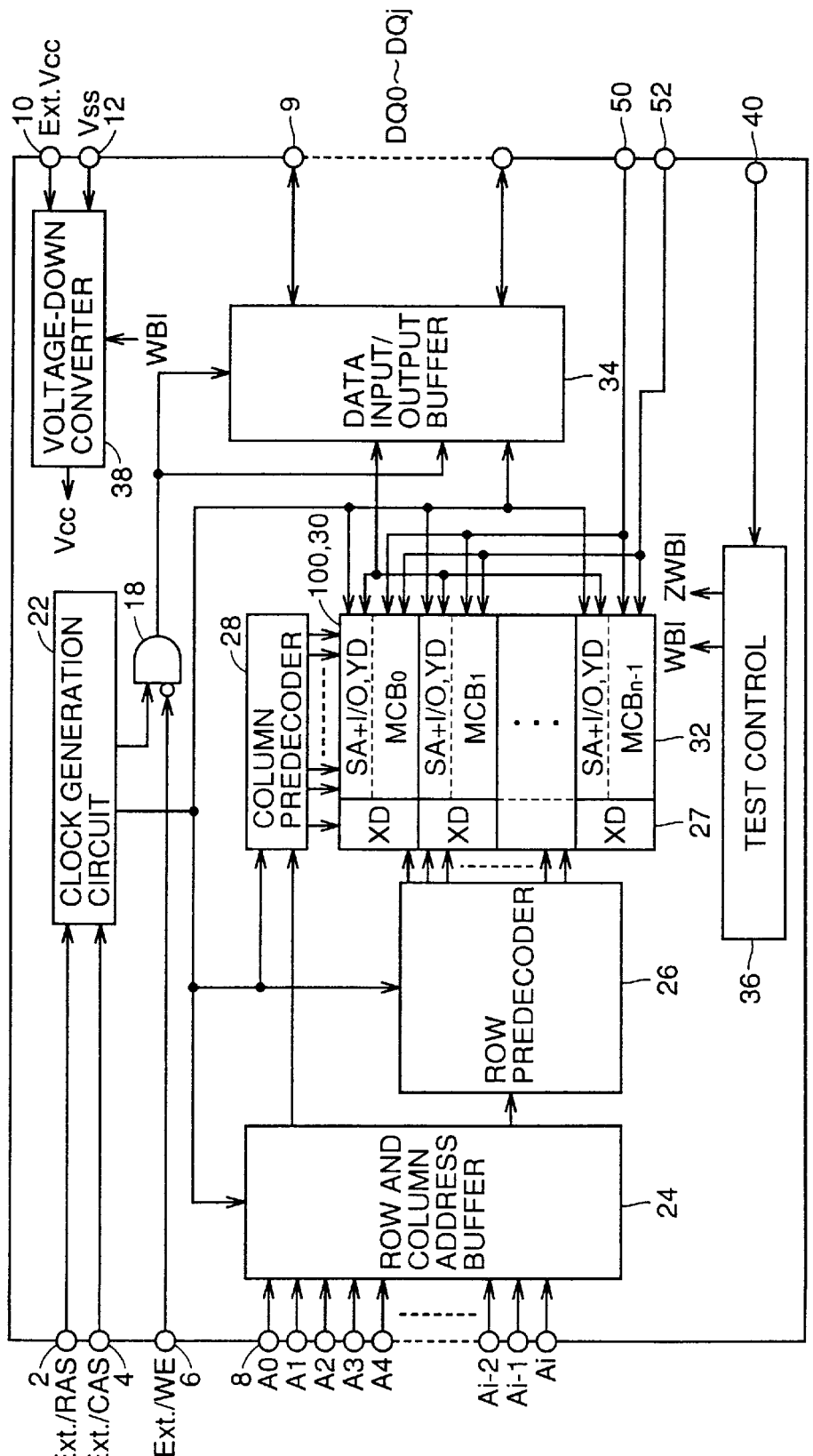
FIG. 1 is a schematic block diagram showing a configuration of a semiconductor memory device 1000 according to a first embodiment of the present invention.

FIG. 1 is a schematic block diagram showing a configuration of a semiconductor memory device 1000 according to a first embodiment of the present invention.

As shown in FIG. 1, semiconductor memory device 1000 includes control signal input terminal groups 2, 4, 6 receiving an external row address strobe signal ext./RAS, an external column address strobe signal ext./CAS, an external write enable signal ext./WE and the like, respectively, an address input terminal group 8, a data input/output terminal group 9 for transmitting and receiving a data signal, a ground terminal 12 receiving a ground potential Vss, and a power supply terminal 10 receiving a power supply potential ext.Vcc.

Semiconductor memory device 1000 also includes a dock generation circuit 22 receiving a control signal and generating an internal control signal for controlling an internal operation of semiconductor memory device 1000, a row and column address buffer 24 receiving an external address signal and producing an internal address signal, a row predecoder 26 receiving a signal from row and column address buffer 24 and producing a signal for row selection, a column predecoder 28 receiving a signal from row and column address buffer 24 and producing a signal for column selection, a sense amplifier+input/output control circuit 30, a memory cell array 32, and a data input/output buffer 34.

Clock generation circuit 22 generates a control clock corresponding to a predetermined mode of operation based on external row and column address strobe signals ext./RAS and ext./CAS externally applied through control signal input terminals 2 and 4, for generally controlling the operation of the semiconductor memory device. A gate circuit 18 receives an output from clock generation circuit 22 and external write enable signal ext./WE to produce a signal controlling an operation of data input/output buffer 34 in write and read operations.

Row and column address buffer circuit 24 uses externally applied address signals AO to Ai (i is a natural number) to produce an internal address signal and feeds the internal address signal to row and column predecoders 26 and 28.

The memory cell array is divided in a plurality of memory cell blocks MCB0–MCBn. Each memory cell block is provided with a row decoder 27 responsive to a predecoded row signal from row predecoder 26 for selecting a row (a word line) in the memory cell block, a column decoder 100 responsive to a predecoded column signal from column predecoder 28 for selecting a column (a bit line pair) in the memory cell block, and an I/O circuit each provided for a bit line pair for selectively transmitting to data input/output buffer 34 the data from a bit line pair selected by column decoder 100 and a sense amplifier SA amplifying the data stored in a memory cell selected. For the sake of convenience, FIG. 1 shows column decoder (YD) 100, sense amplifier SA and I/O circuit 30 collectively in a single block.

That is, row decoder 27 and column decoder 100 together designate in memory cell array 32 a memory cell, which communicates data externally via sense amplifier+I/O circuit 30 and data input/output buffer 34 through input/output terminal group 9.

Semiconductor memory device 1000 also includes a test control circuit 36 responsive to a signal WBI through a WBI pad for operating in a burn-in test mode to output signal WBI for controlling a test operation and a signal ZWBI corresponding to an inverted version of signal WBI, and a potential supply pads 50 and 52 for externally supplying a predetermined power supply potential level in the burn-in test mode.

Semiconductor memory device 1000 also includes a voltage-down converter 38 receiving external power supply potential Ext.Vcc and ground potential Vss and generating an internal power supply potential Vcc. Voltage-down converter 38 is controlled for example by signal WBI to operate in the burn-in test mode to stop a voltage-down operation and supply external power supply potential Ext.Vcc as internal power supply potential Vcc into semiconductor memory device 1000.

It should be noted that FIG. 1 only shows a representative example of the semiconductor memory device 1000 configuration and the present invention is generally applicable to other configurations of dynamic semiconductor memory devices. For example, a DRAM may have a memory cell array divided in a manner other than as shown in FIG. 1 and semiconductor memory device 1000 may be integrated on a single chip together with other circuits.

Figure 2:
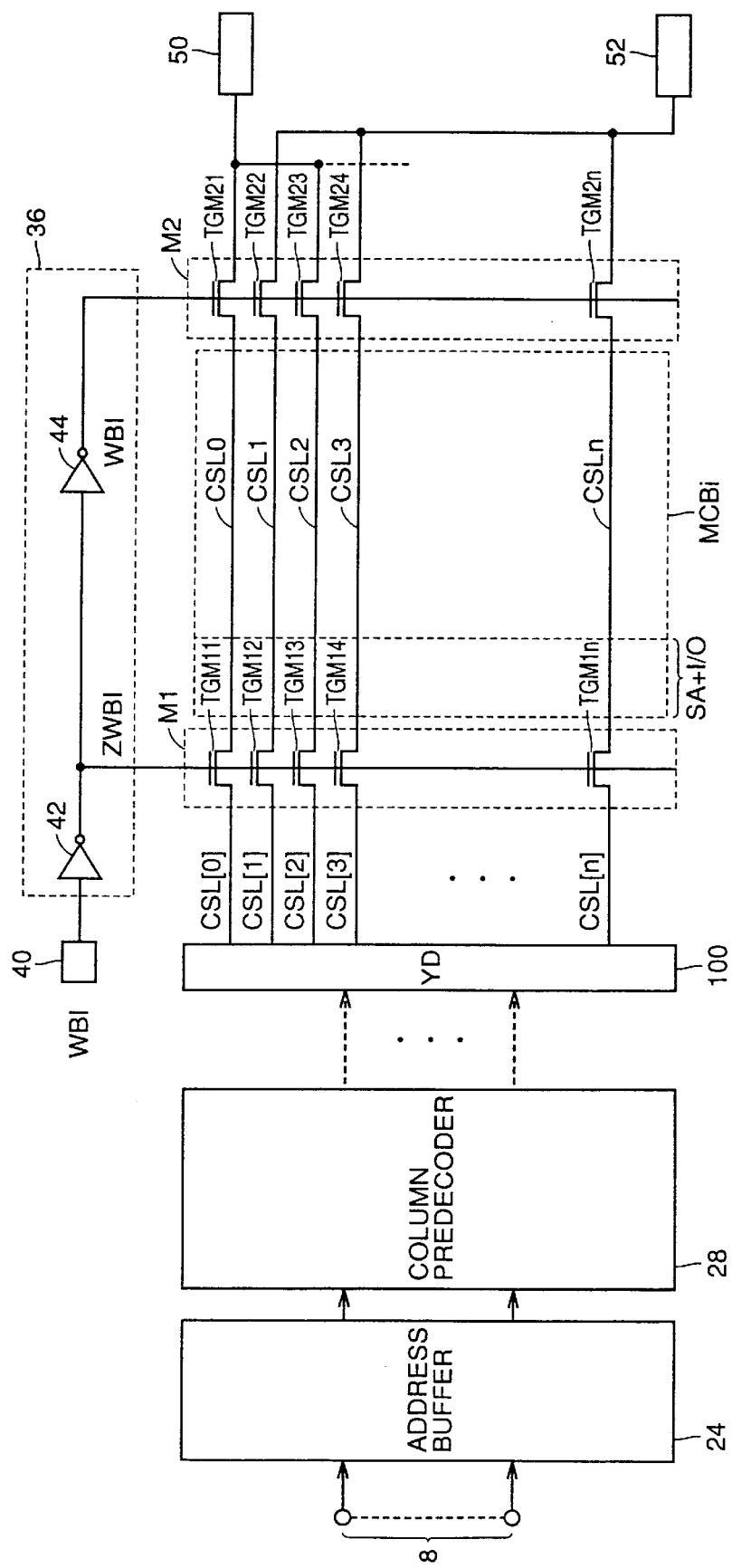
FIG. 2 is a schematic block diagram showing a configuration corresponding to a memory cell block MCBi of the first embodiment.

FIG. 2 is a schematic block diagram of the configuration of semiconductor memory device 1000 according to the first embodiment of the present invention, extracting the configuration of a portion corresponding to one memory cell block MCBi, wherein i represents a natural number.

More specifically, address buffer circuit 24 feeds an internal address signal to column predecoder 28. Column predecoder 28 predecodes the received signal. Column decoder 100 receives the predecoded signal and selectively activates column select signals CSL[0] to CSL[n], wherein n represents a natural number, to select a column of memory cells in memory cell block MCBi associated therewith.

Column select signals CSL[0] to CSL[n] output from column decoder 100 are transmitted on column select lines CSL0 to CSLn, respectively, to memory cell block MCBi.

Between memory cell block MCBi and column decoder 100 is provided a transfer gate Ml including gate transistors TGM11 to TGM1n for the column select lines, respectively.

With memory cell block MCBi interposed, provided at the other end of column select lines CSL0 to CSLn is a transfer gate M2.

Transfer gate M2 also includes gate transistors TGM21 to TGM2n for column select lines CLS0 to CSLn, respectively.

Transistors TGM11 to TGM1n have their respective gates commonly receiving signal ZWBI or a signal fed through WBI pad 40 and inverted by an inverter 42 provided in test control circuit 36, and gate transistors TGM21 to TGM2n have their respective gates commonly receiving signal WBI or an output from inverter 42 in test control circuit 36 and inverted by an inverter 44 also provided therein.

Even-numbered column select lines CSL0, CSL2, . . . , are connected via transfer gate M2 to even-numbered CSL pad 50, and odd-numbered column select lines CSL1, CSL3, . . . , are connected via transfer gate M2 to an odd-numbered CSL pad 52. In a burn-in test period, through pads 50 and 52 the column select lines receive a stress voltage.

Figure 3:
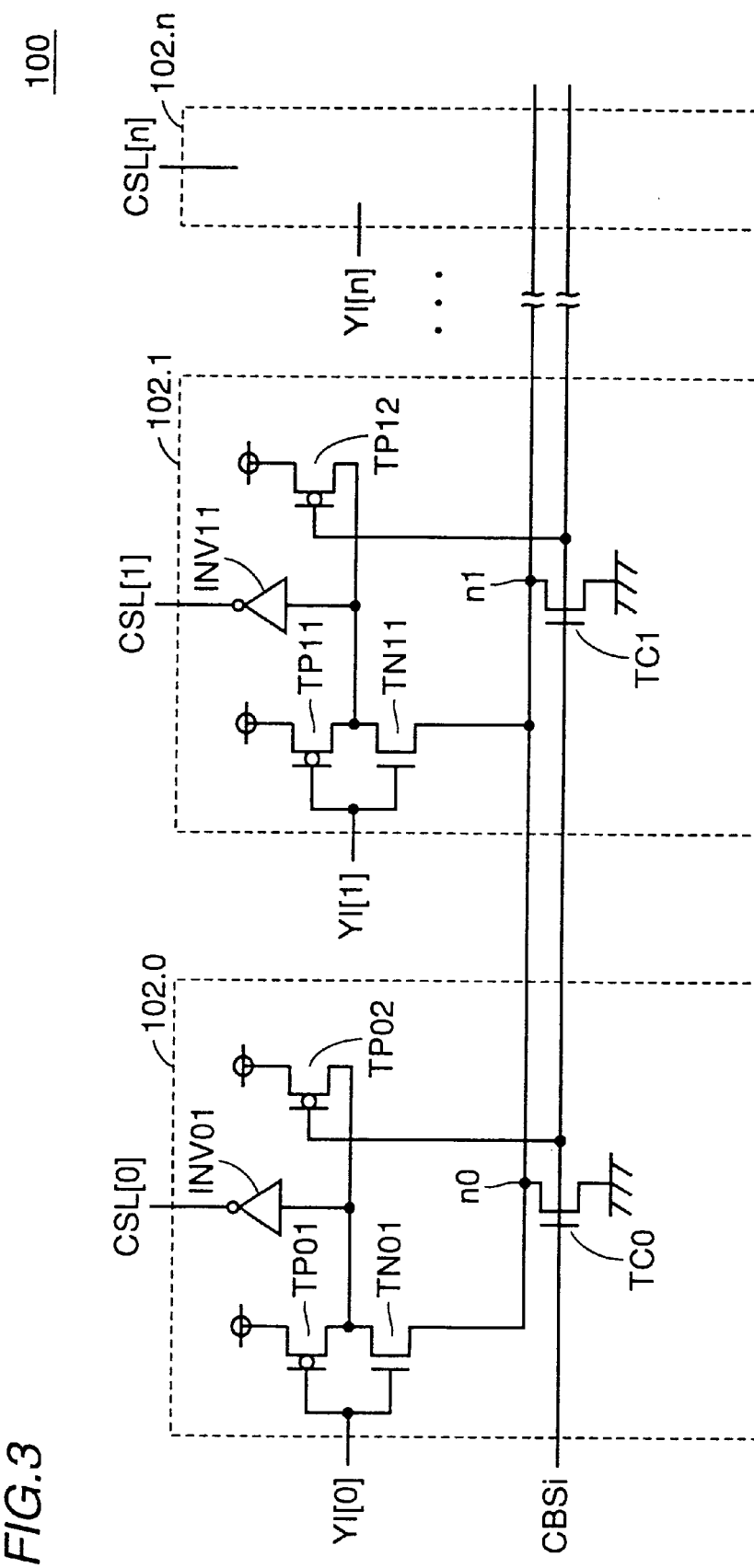
FIG. 3 is a schematic block diagram for illustrating a configuration of a column decoder 100.

FIG. 3 is a schematic block diagram for illustrating a configuration of column decoder 100.

Column decoder 100 includes column select signal generation portions 102.0 to 102.n generating column select signals CSL[0] to CSL[n] corresponding to predecoded column signals Y[0] to Y[n], respectively.

Column select signal generation portion 102.0 includes a transistor TC0 connected between ground potential Vss and an internal node n0 and having a gate receiving a CSL block select signal CBSi indicating that memory cell block MCBi has been selected, p- and n-channel MOS transistors TP01 and TN01 connected in series between internal node n0 and internal power supply potential Vcc and having their respective gates receiving a predecoded column address signal YI[0], a p-channel MOS transistor TP02 connected between power supply potential Vcc and a node interconnecting transistors TP01 and TN01 and having a gate receiving signal CBSi, and an inverter INV01 receiving as an input a potential of the node interconnecting transistors TP01 and TN01 and outputting column select signal CSL[O].

In column decoder 100, column select signal generation portions 102.1 to 102.n provided for predecoded column signals YI[1], . . . , YI[n], respectively, are basically similar in configuration to column select signal generation portion 102.0 for predecoded column address signal YI[0].

More specifically, when signal CBSi is placed in the active state, transistors TC0, TC1, . . . , TCn responsively turn on and transistors TP02, TP12, . . . , TPn2 all turn off. As such, in column select signal generation portion 102.0, for example, the inverter configured by transistors TP01 and TN01 drives an input level of inverter INV0 in response to a level of predecoded column address signal YI[0].

This also applies to column select signal generation portions 102.1 to 102.n provided for other predecoded column address signals.

When CSL block select signal CBSi is placed in the inactive state (driven low), transistor TP02 and the like turn on and inverter INV0 and the like output column select signals CSL[0] to CSL[n] all driven low.

Figure 4:
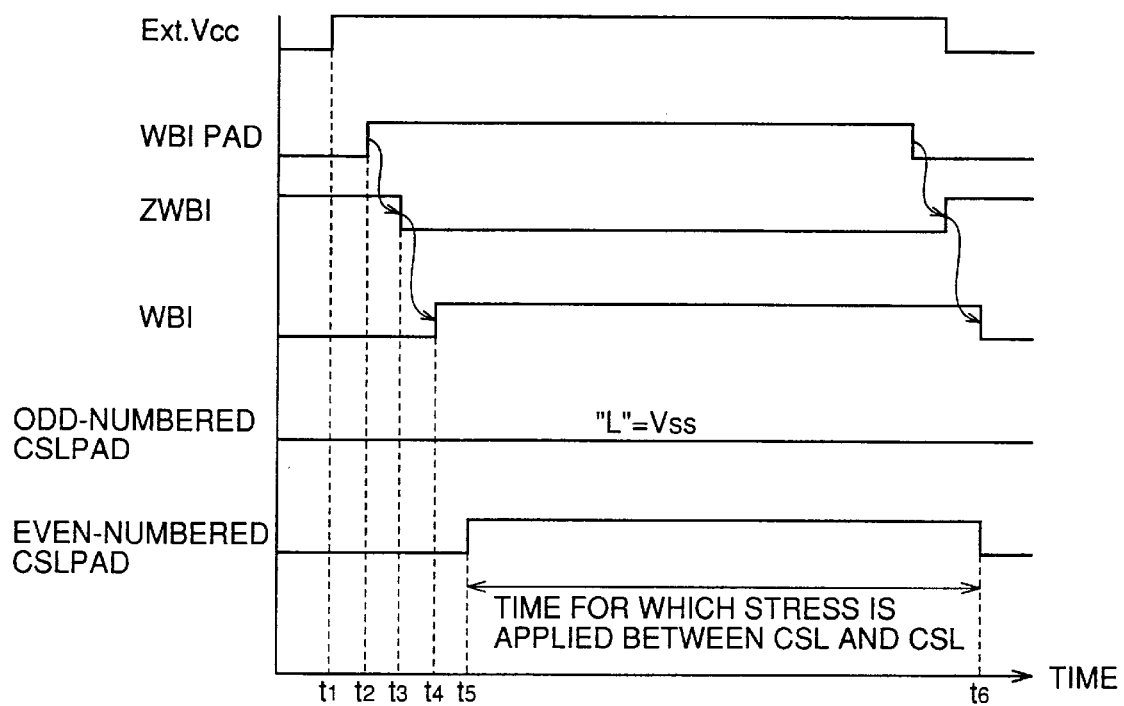
FIG. 4 is timing plots for representing an operation of semiconductor memory device 1000 of the first embodiment.

FIG. 4 is timing plots for representing an operation of semiconductor memory device 1000 according to the first embodiment.

At time t11, upon power-on, external power supply potential Vcc rises to a predetermined potential level (e.g., of 3.3 V).

At time t2, WBI pad 40 receives a signal having an active level for indicating that a wafer-level burn-in test is to be conducted, and responsively inverter 42 outputs signal ZWBI driven low, and at time t4 inverter 44 outputs signal WBI transitioning high.

Then, at time t5, even-numbered CSL pad 50 and odd-numbered CSL pad 52 for example receive power supply potential Ext.Vcc and ground potential Vss, respectively, so that in a period of the wafer burn-in test mode from time t5 through time t6 a voltage stress is applied between an even-numbered column select line and an odd-numbered column select line.

As such, between adjacent column select lines any voltage stress can be applied to manifest an initial failure and thus screen any chips having such failure.

Furthermore, while signal WBI is being placed in the active state transistor gate M1 can disconnect column decoder 100 from the column select lines. As such, on the column select lines any excess load capacitance does not exist so that between the column select lines a sufficient stress can be applied.

Furthermore, the minimized number of pads per chip may each have an externally controlled potential to conduct the burn-in test as described above.

Second Embodiment

Figure 5:
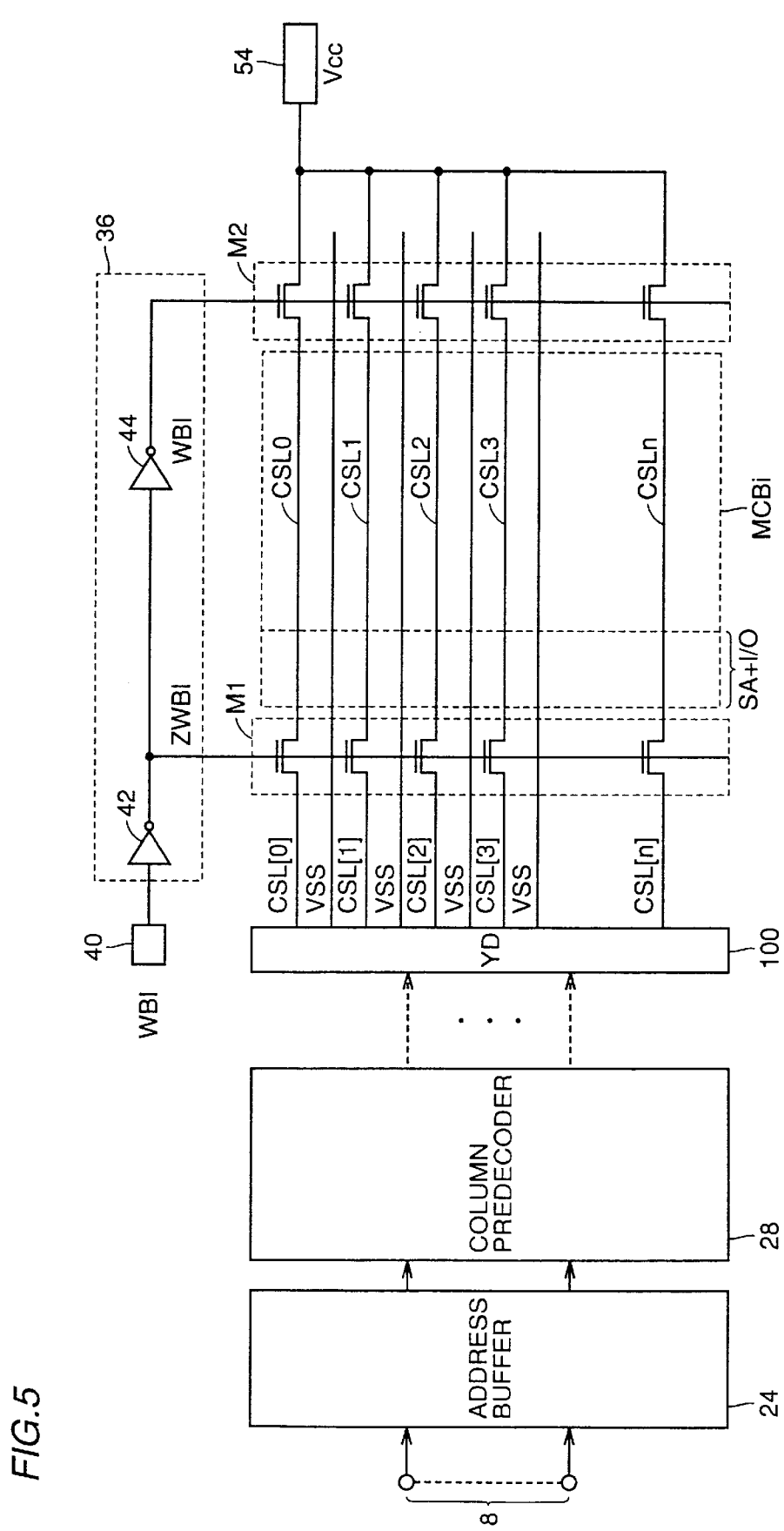
FIG. 5 is a schematic block diagram for illustrating a configuration corresponding to a memory cell block MCBi of a semiconductor memory device of a second embodiment of the present invention.

FIG. 5 is a schematic block diagram extracting a configuration of a portion corresponding to memory cell block MCBi of a semiconductor memory device according to a second embodiment of the present invention, as compared to the first embodiment as shown in FIG. 2.

The semiconductor memory device of the present embodiment is distinguished from semiconductor memory device 1000 of the first embodiment in that a power supply line for supplying ground potential Vss for example to a sense amplifier arranged in each memory cell block and each of column select lines CLS0 to CSLn are arranged alternately, in a so-called meshed arrangement of power supply lines.

Accordingly, column select lines CSL0 to CSLn are all connected via transfer gate M2 to a CSL pad for Vcc 54.

As such, while WBI pad 40 is receiving a signal having the active level (driven high), in memory cell block MCBi all column select lines CSL0 to CSLn can receive any potential, e.g., power supply potential Ext.Vcc via transfer gate M2 through CSL pad for Vcc 54.

As such, in a wafer-level burn-in test a voltage stress can be applied between a column select line and a grounding power-supply line.

Figure 6:
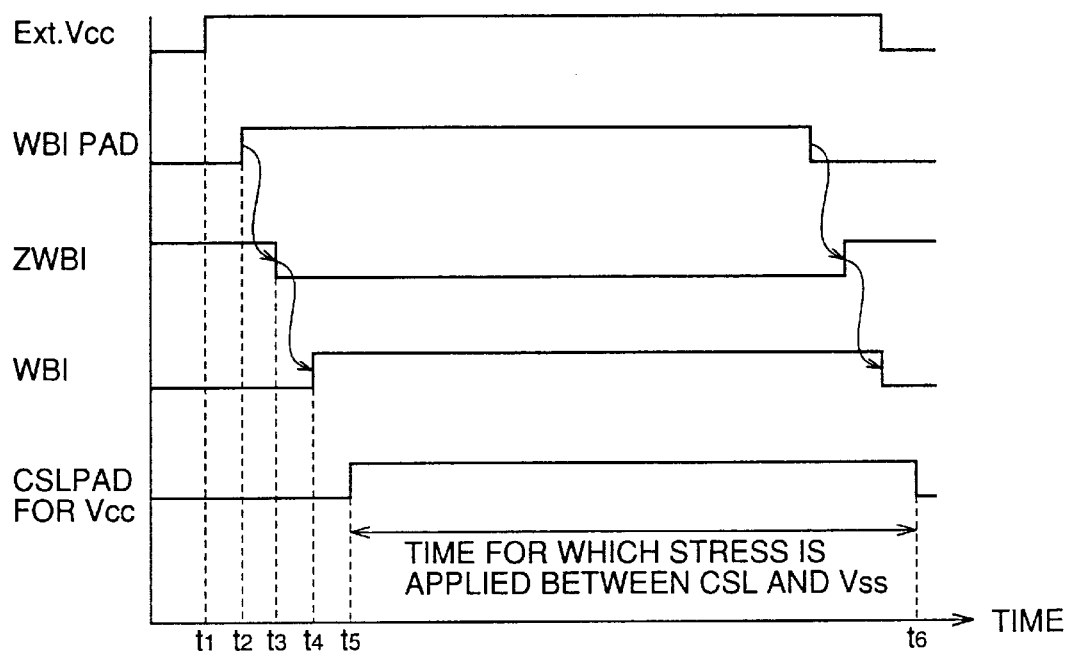
FIG. 6 is timing plots for representing an operation of the semiconductor memory device of the second embodiment.

FIG. 6 is timing plots for representing an operation of the semiconductor memory device according to the second embodiment of the present invention.

At time t1, external power supply potential Ext.Vcc rises to a predetermined potential level (e.g., of 3.3 V).

At time t2, signal WBI is placed in the active state (driven high), and responsively signal ZWBI output from inverter 42 is driven low at time t3, and responsively signal WBI output from inverter 44 goes high at time t4.

Thus, transfer gate M2 turns on.

At time t5, CSL pad for Vcc 54 receives power supply potential Ext.Vcc, so that, as has been described above, during a period of the wafer burn-in test from time t5 through time t6 a voltage stress can be applied between a column select line and a grounding power-supply line.

As such, such memory chip can be screened that has a latent, initial failure such as a short-circuit failure between a grounding power-supply line and a column select line.

Third Embodiment

Figure 7:
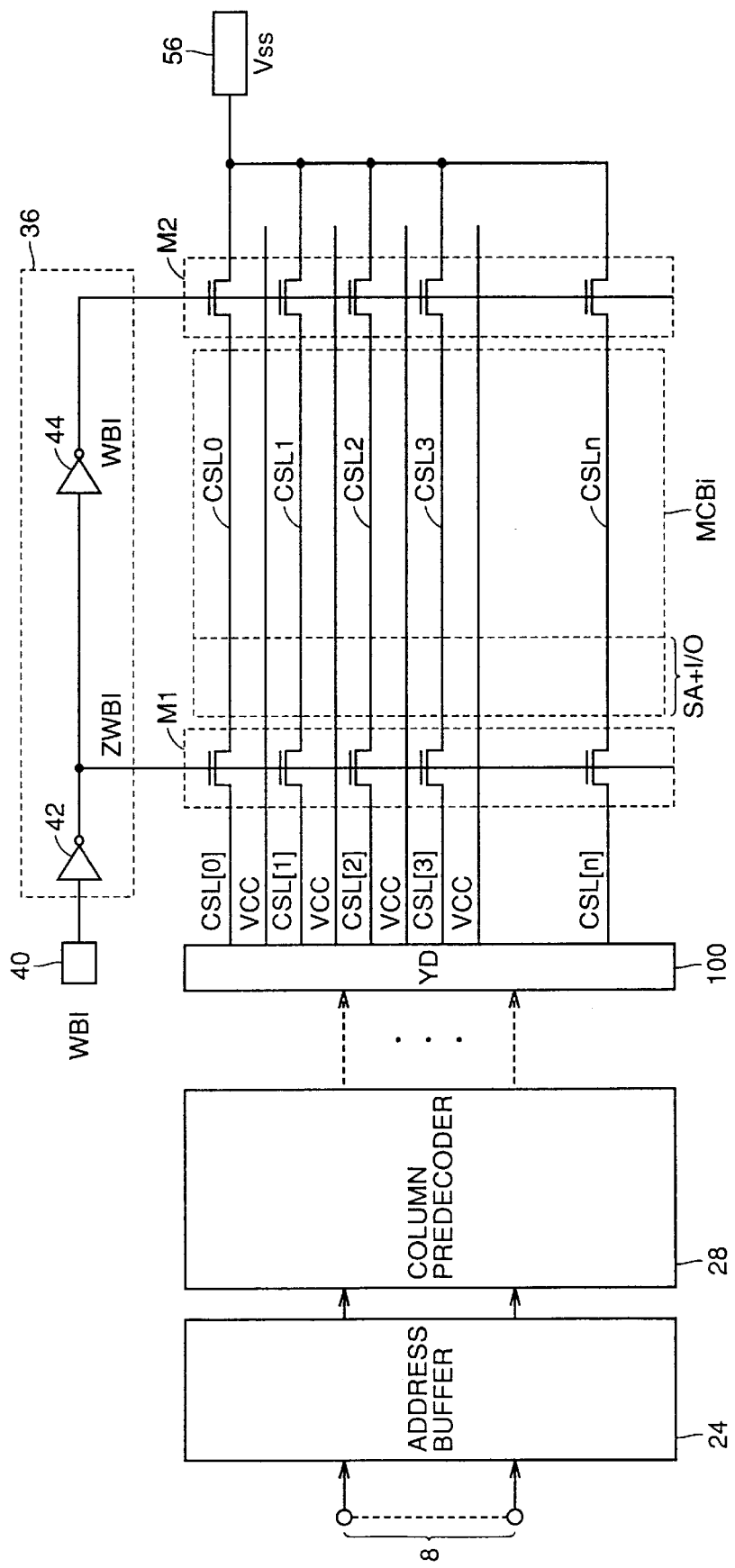
FIG. 7 is a schematic block diagram showing a configuration corresponding to a memory cell block MCBi of a semiconductor memory device of a third embodiment of the present invention.

FIG. 7 is a schematic block diagram extracting a configuration of a portion corresponding to memory cell block MCBi of a semiconductor memory device according to a third embodiment of the present invention, as compared to the second embodiment as shown in FIG. 5.

The semiconductor memory device of the present embodiment is distinguished from that of the second embodiment in that a power supply line for supplying power supply potential Vcc to a sense amplifier and other components arranged in each memory cell block and each of column select lines CSL0 to CSLn are arranged alternately, in a meshed arrangement of power supply lines. Furthermore, column select lines CSL0 to CSLn are all connected via transfer gate M2 to a CSL pad for Vss 56.

As such, while WBI pad 40 is receiving a signal having the active level (driven high), in memory cell block MCBi column select lines CSL0 to CSLn can all receive any potential, e.g., ground potential Vss via transfer gate M2 through CSL pad for Vss 56.

As such, in a wafer-level burn-in test a voltage stress can be applied between a column select line and a power supply line.

Figure 8:
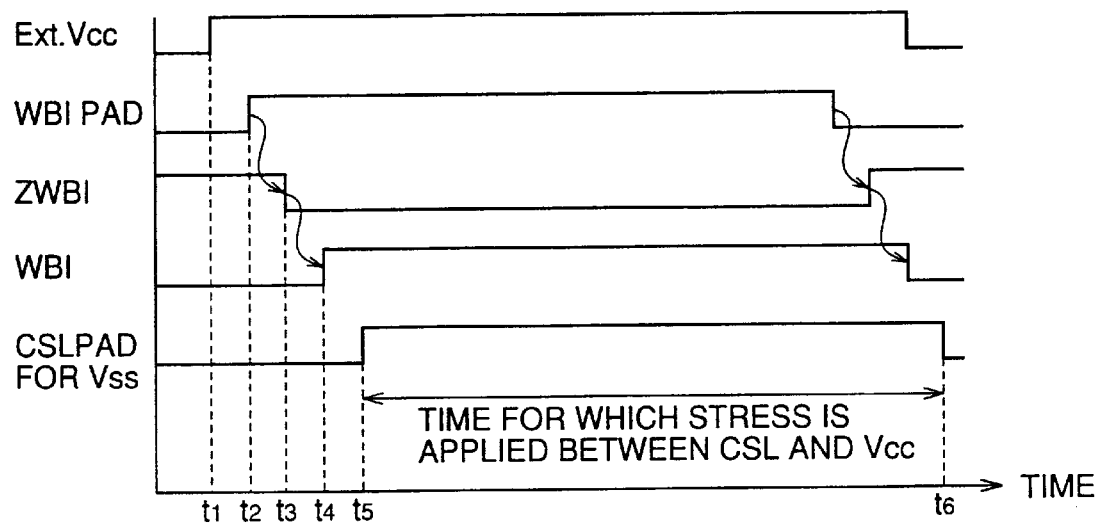
FIG. 8 is timing plots for representing an operation of the semiconductor memory device of the third embodiment.

FIG. 8 is timing plots for representing an operation of the semiconductor memory device according to the third embodiment of the present invention.

At time t1, external power supply potential Ext.Vcc rises to a predetermined potential level (e.g., of 3.3 V).

At time t2, signal WBI is placed in the active state (driven high), and responsively signal ZWBI output from inverter 42 is driven low at time t3, and responsively signal WBI output from inverter 44 goes high at time t4. Thus, transfer gate M2 turns on.

At time t5, CSL pad for Vss 56 receives ground potential Vss, so that, as has been described above, during a period of the wafer burn-in test from time t5 through time t6 a voltage stress can be applied between a column select line and a grounding power-supply line.

As such, such memory chip can be screened that has a latent, initial failure such as a short-circuit failure between a power supply line and a column select line.

Fourth Embodiment

Figure 9:
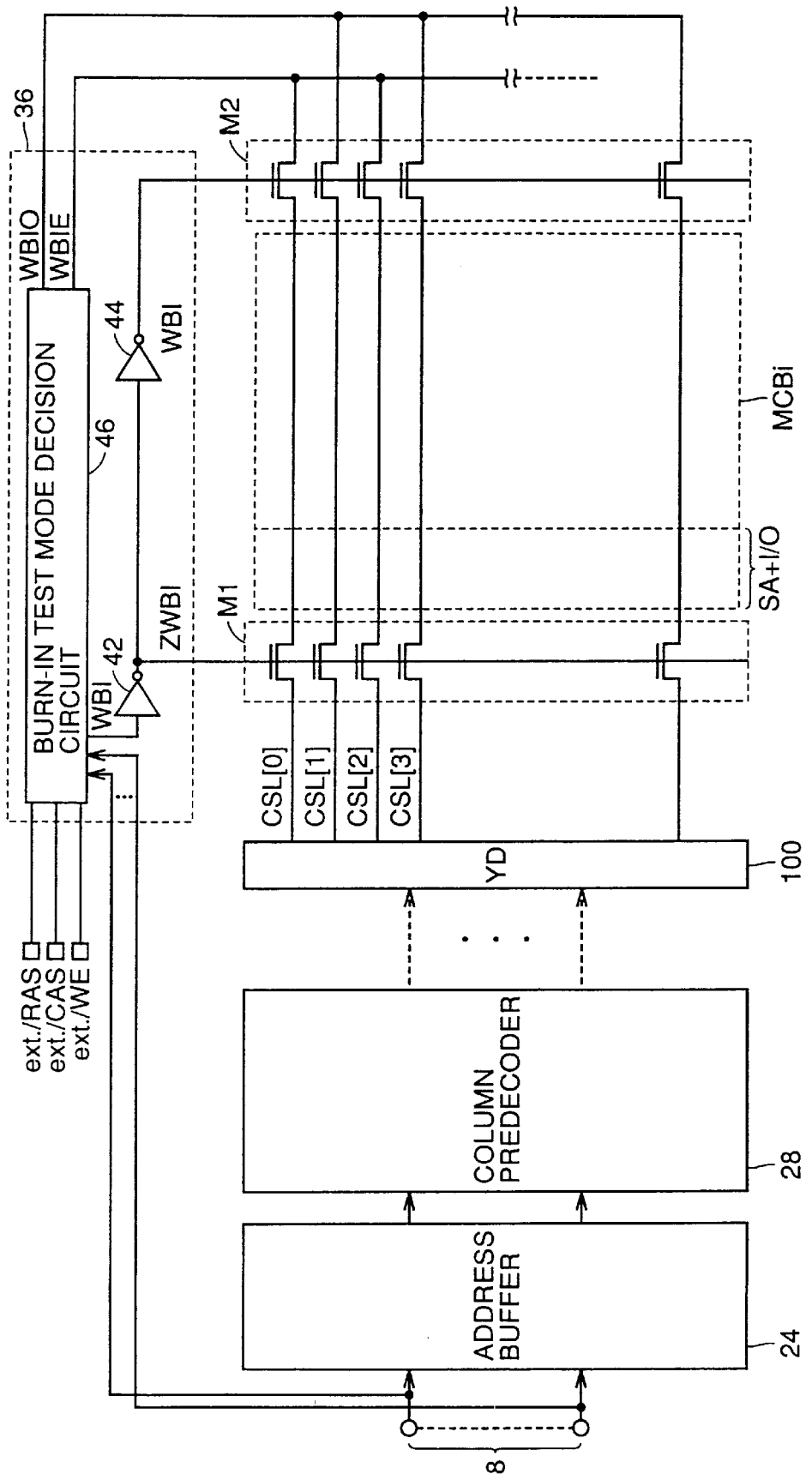
FIG. 9 is a schematic block diagram showing a configuration corresponding to a memory cell block MCBi of a semiconductor memory device of a fourth embodiment of the present invention.

FIG. 9 is a schematic block diagram extracting from a configuration of a semiconductor memory device according to a fourth embodiment of the present invention a configuration of a portion corresponding to memory cell block MCBi and a burn-in test mode decision circuit 36 for detecting designation of a burn-in test mode.

While the semiconductor memory devices of the first to third embodiments have been described in conjunction with a configuration for applying a stress thereto in the form of a wafer, the semiconductor memory device of the present embodiment is described in conjunction with a configuration for applying a stress thereto after it is assembled and thus provided as a finished product.

With reference to FIG. 9, in test control circuit 36 a burn-in test mode decision circuit 46 detects that the burn-in test mode has been designated according to a predetermined combination of external control signals ext./RAS, ext./CAS, ext./WE and an address signal and, as will be described hereinafter, generates an internal control signal WBIO and signals WBIE and WBI for controlling an operation in the burn-in test mode.

In test control circuit 36, inverter 42 receives a signal fed from burn-in test mode decision circuit 46, rather than a signal fed through a WBI pad, as in the first embodiment, and outputs signal ZWBI for controlling transfer gate M1, and inverter 44 receives an output from inverter 42 and generates signal WBI for controlling transfer gate M2.

Signal WBIE is applied via transfer gate M2 to even-numbered column select lines and signal WBIO is applied via transfer gate M2 to odd-numbered column select lines.

Figure 10:
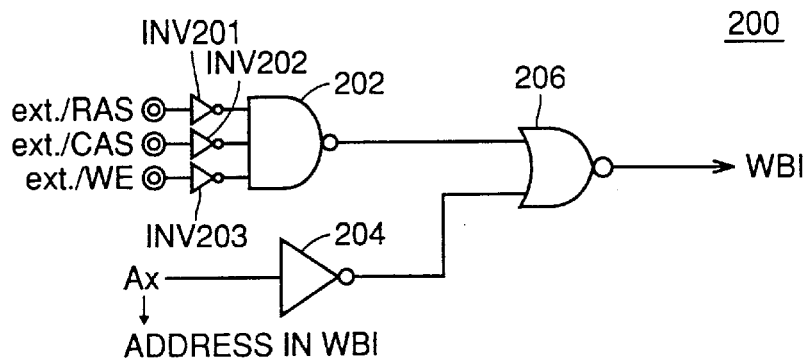
FIG. 10 is a circuit diagram for illustrating a configuration of a WBI generation circuit 200 in a burn-in test mode decision circuit 36.
Figure 11:
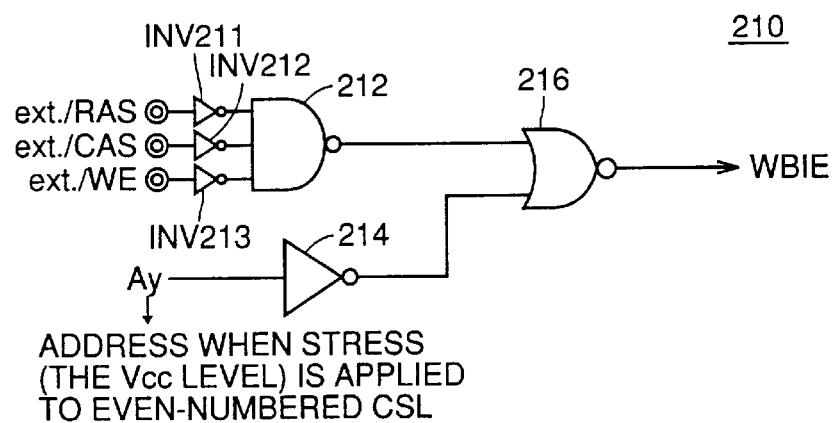
FIG. 11 is a circuit diagram for illustrating a WBIE generation circuit 210 in burn-in test mode decision circuit 36.
Figure 12:
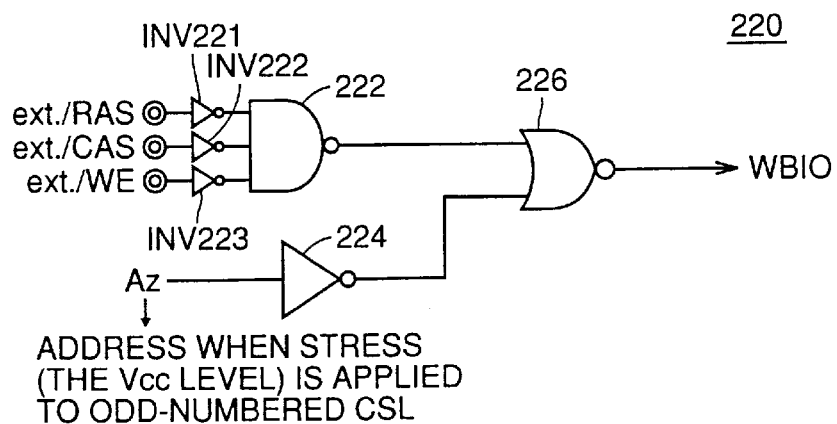
FIG. 12 is a circuit diagram for illustrating a configuration of a WBIO generation circuit in burn-in test mode decision circuit 36.

FIGS. 10 to 12 are circuit diagrams respectively showing a WBI generation circuit 200, a WBIE generation circuit 210 and a WBIO generation circuit 222 in configuration included in burn-in test mode decision circuit 36.

Initially, with reference to FIG. 10, WBI generation circuit 200 for generating signal WBI includes inverters INVs 201, 202, 203 inverting external control signals ext./RAS, ext./CAS, ext./WE to provide their inverted versions, a gate circuit 202 for outputting a result of an NAND operation on the outputs from inverters INVs 201 to 203, an inverter 204 receiving a predetermined bit signal AX of an address signal used in designating a WBI test mode, and an NOR circuit 206 receiving an output from gate circuit 202 and an output from inverter 204 and outputting signal WBI.

For example, when signal ext./WE is placed in the active state (driven low) and signals ext./RAS and ext./CAS are then both set low, gate circuit 202 outputs a signal driven low.

If at this time point address signal bit Ax is logical high then inverter 204 also outputs a signal driven low and NOR circuit 206 thus outputs signal WBI driven high.

As shown in FIG. 11, WBIE generation circuit 210 for generating signal WBIE includes inverters INVs 211, 212, 213 inverting external control signals ext./RAS, ext./CAS, ext./WE to provide their inverted versions, a gate circuit 212 for outputting a result of an NAND operation on the outputs from inverters INVs 211 to 213, an inverter 214 receiving a predetermined bit signal Ay of an address signal used in designating the WBI test mode, and an NOR circuit 216 receiving an output from gate circuit 212 and an output from inverter 214 and outputting signal WBIE.

In WBIE generation circuit 210 also, when signal ext./WE is placed in the active state (driven low) and signals ext./RAS and ext./CAS are then both set low, gate circuit 212 outputs a signal driven low. If at this time point address signal bit Ay is logical high then inverter 214 also outputs a signal driven low in level and NOR circuit 216 thus outputs signal WBIE driven high.

As shown in FIG. 12, WBIE generation circuit 220 for generating signal WBIE includes inverters INVs 221, 222, 223 inverting external control signals ext./RAS, ext./CAS, ext./WE to provide their inverted versions, a gate circuit 222 for outputting a result of an NAND operation on the outputs from inverters INVs 221 to 223, an inverter 224 receiving a predetermined bit signal Az of an address signal used in designating the WBI test mode, and an NOR circuit 226 receiving an output from gate circuit 222 and an output from inverter 224 and outputting signal WBIO.

In WBIE generation circuit 220 also, when signal ext./WE is placed in the active state (driven low) and signals ext./RAS and ext./CAS are then both set low, gate circuit 212 outputs a signal driven low in level. If at this time point address signal bit Az is logical high in level then inverter 224 also outputs a signal driven low in level and NOR circuit 226 thus outputs signal WBIO driven high in level.

Figure 13:
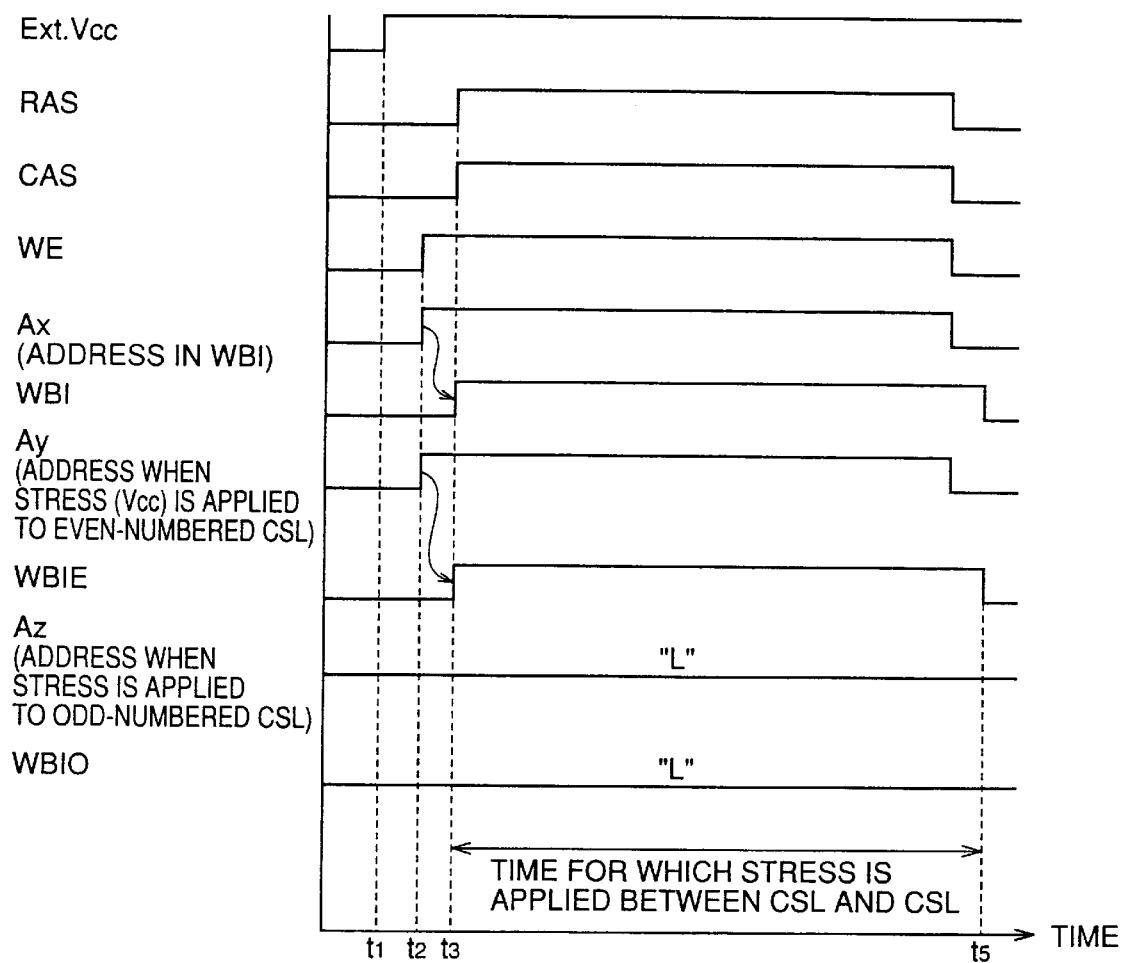
FIG. 13 is timing plots for representing an operation of a semiconductor memory device according to a fourth embodiment of the present invention.

FIG. 13 is timing plots for representing an operation of the semiconductor memory device according to the fourth embodiment of the present invention.

At time t1, external power supply potential Ext.Vcc rises to a predetermined potential level.

Then, at time t2, an inverted version of signal ext./WE, i.e., signal WE is placed in the active state and address signal bit Ax is also placed in the active state. Then, at time t3, an inverted version of signal ext./RAS or a signal RAS and an inverted version of signal ext./CAS or a signal CAS go high, and responsively signal WBI is placed in the active state (driven high).

Furthermore, at time t2 address signal bit Ay is driven high and responsively at time t3 signal WBIE is also placed in the active state (driven high).

Thus, during a period of the burn-in test from time t3 through time t5 signal WBIE is placed in the active state so that of the column select lines even-numbered column select lines CSL0, CSL2, . . . , receive internal power supply potential Vcc equal in potential to power supply potential Ext.Vcc output from voltage-down converter 38 and odd-numbered column select lines CSL1, CSL3, . . . , receive ground potential Vss in response to signal WBI0 being low in level.

Thus, during a period of the burn-in test a voltage stress can be applied between an even-numbered column select line and an odd-numbered column select line.

It should be noted that the stress potential applied to a column select line in the burn-in test is not required to be equal in potential to external power supply voltage Ext.Vcc and voltage-down converter 38 may also generate an internal power supply voltage of a predetermined potential level in the burn-in test as well.

Fifth Embodiment

Figure 14:
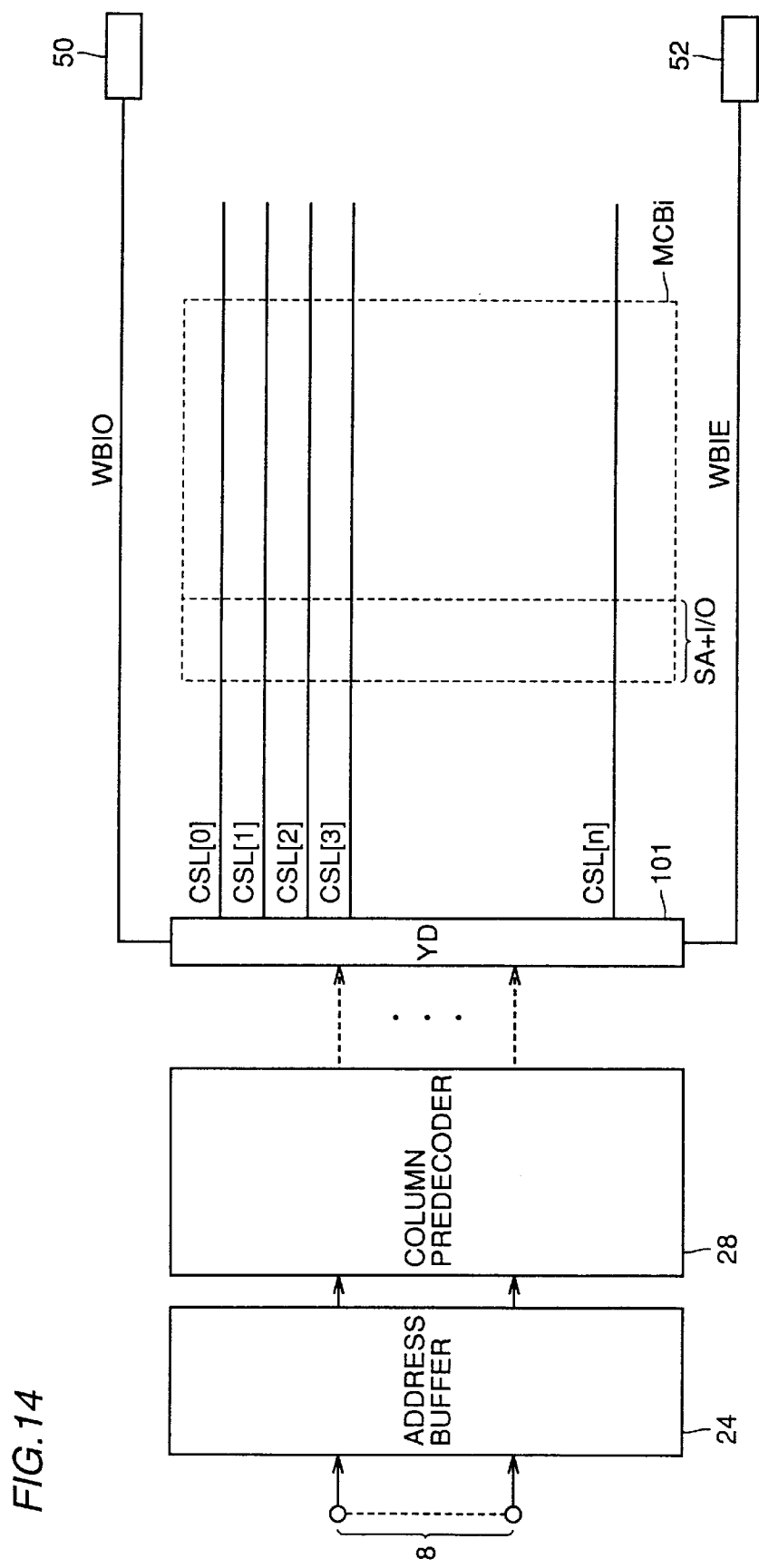
FIG. 14 is a schematic block diagram for illustrating a configuration of a portion corresponding to a memory cell block MCBi of a semiconductor memory device of a fifth embodiment of the present invention.

FIG. 14 is a schematic block diagram extracting a configuration corresponding to memory cell block MCBi of a semiconductor memory device according to a fifth embodiment of the present invention, as compared to the first embodiment as shown in FIG. 2.

The semiconductor memory device of the fifth embodiment is distinguished in configuration from that shown in FIG. 2 in that column decoder 101 receives signal WBIE fed through even-numbered CSL pad 50 and signal WBIO fed through odd-numbered CSL pad 52 to drive column select lines CSL0 to CSLn.

Figure 15:
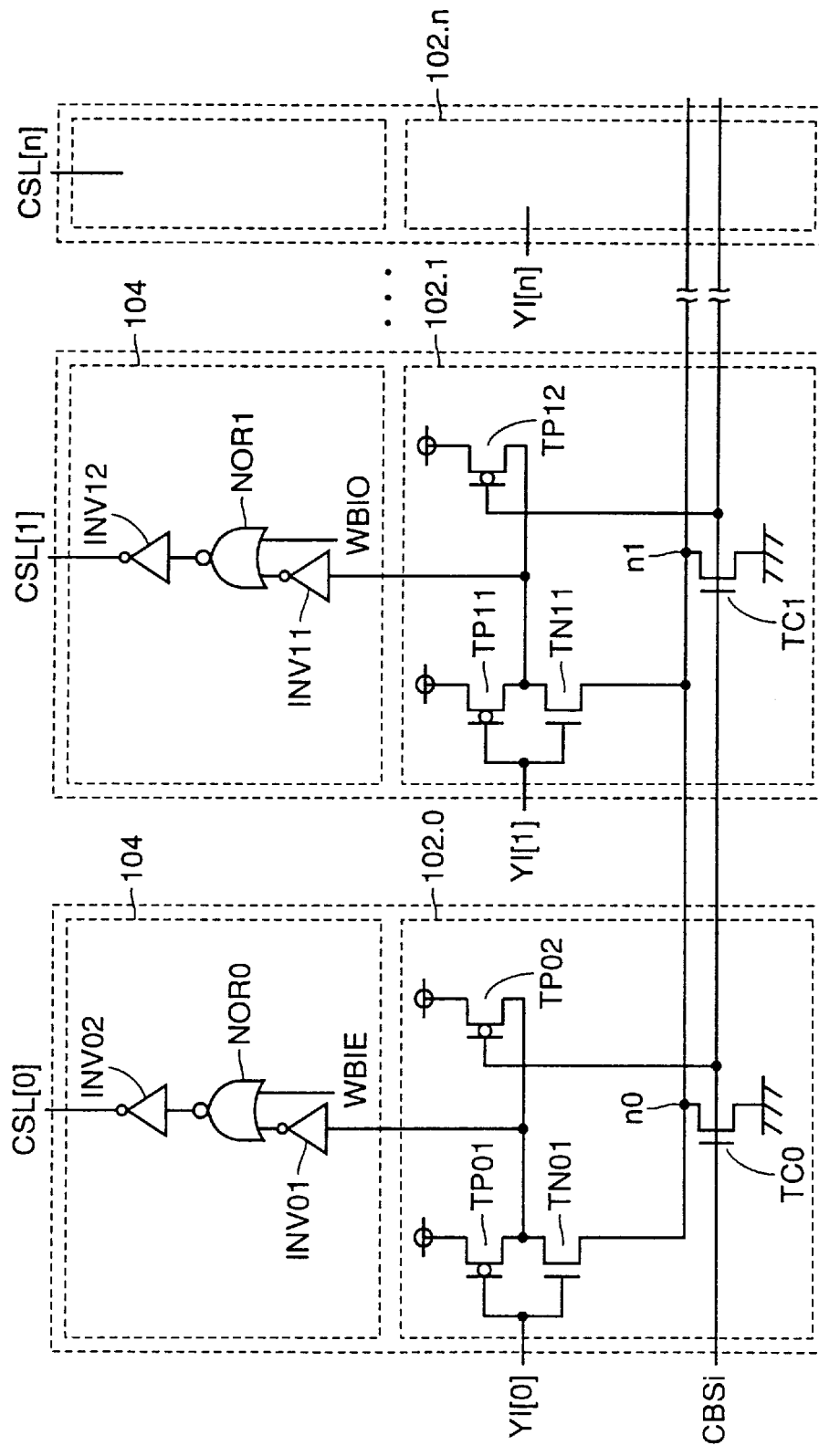
FIG. 15 is a circuit diagram for illustrating a configuration of a column decoder 101 according to the fifth embodiment.

FIG. 15 is a schematic block diagram for illustrating a configuration of column decoder 101 shown in FIG. 14.

The FIG. 14 column decoder 101 is the FIG. 3 column decoder 100 according to the first embodiment plus a stress potential control circuit 104 controlled by signal WBIE or WBIO to control a level of a column select signal.

For example, signal CSL[0], output on a 0th column select line, is generated by a constituent portion provided with stress potential control circuit 104 including an NOR circuit NOR0 receiving an output from inverter INV01 and signal WBIE, and an inverter INV02 receiving an output from NOR circuit NOR0 and outputting signal CSL[0].

A first column select signal CSL[1] is generated by a constituent portion provided with stress potential control circuit 104 including in addition to the FIG. 3 configuration an NOR circuit NOR1 receiving an output from an inverter INV11 and signal WBI0, and an inverter INV12 receiving an output from NOR circuit NOR1 and outputting signal CSL [1].

Other even-numbered column select signals are each output from a configuration basically similar to that generating column select signal CSL[0], and other odd-numbered column select signals are each output from a configuration basically similar to that generating column select signal CSL[1].

Figure 16:
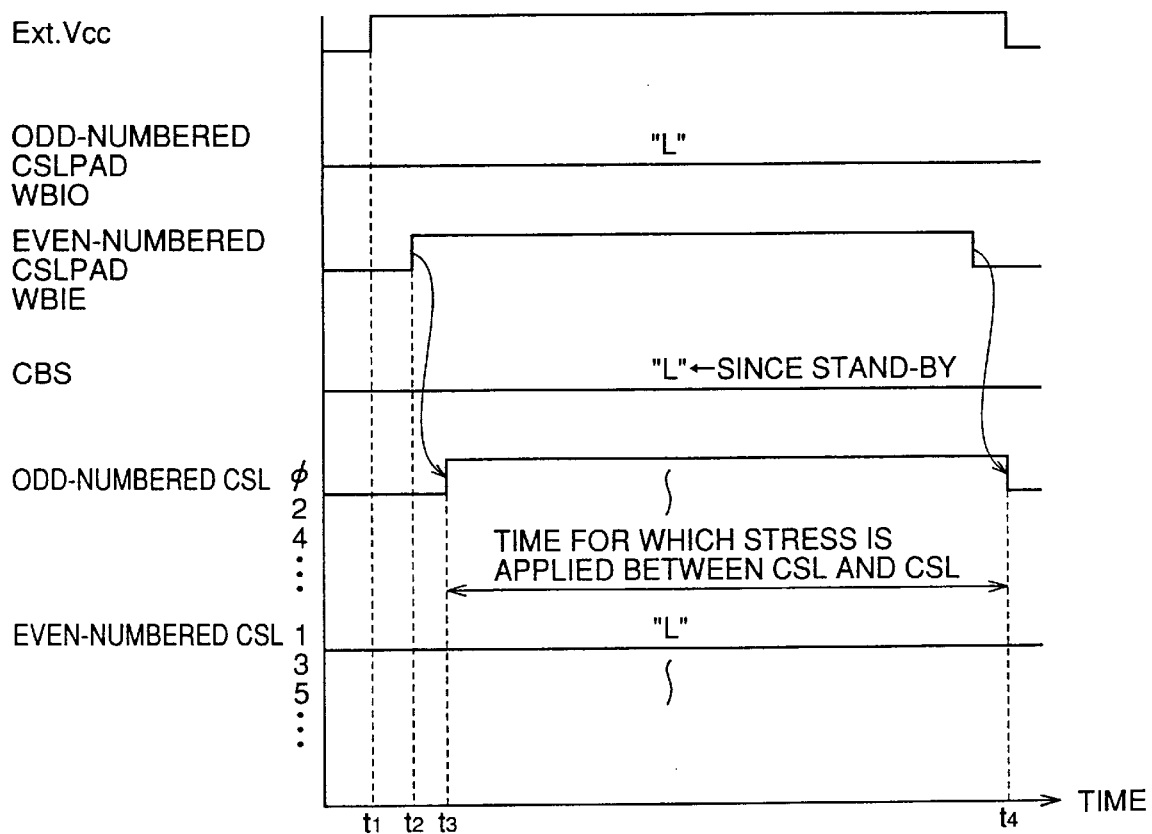
FIG. 16 is timing plots for representing an operation of the semiconductor memory device of the fifth embodiment.

FIG. 16 is timing plots for representing an operation of the semiconductor memory device according to the fifth embodiment shown in FIGS. 14 and 15.

In a stand-by state, or a period during which a read or write operation or any other specific operation mode is not externally designated, block select signal CBSi constantly remains low.

At time t1, external power supply potential Ext.Vcc rises to a predetermined potential level.

At time t2 signal WBIE through even-numbered CSL pad 50 is driven high, and responsively even-numbered column select signals CSL[0], CSL[2] and the like while a wafer-level burn-in test is being conducted attain the internal power supply potential Vcc level.

In contrast, a signal fed through odd-numbered CSL pad 52 is low in level (the ground potential Vss level) and odd-numbered column select signals CSL[1], CSL[3], . . . , all responsively remain low since signal WBI0 is low in level.

Thus, in a period of the wafer-level burn-in test different potential levels can be applied to odd- and even-numbered column select lines, respectively, and a voltage stress can thus be applied between adjacent column select lines.

Thus, any voltage stress can be applied between adjacent column select lines to manifest an initial failure and thus screen any chips having such failure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns;
   a row select circuit-responsive to a row address signal for selecting a row of said memory cell array;
   a plurality of column select lines for selecting a column of said memory cell array;
   a column select circuit responsive to a column address signal for generating a signal for selectively activating at least one of said plurality of column select lines;
   a data input/output circuit communicating stored data with a memory cell column corresponding to an activated one of said plurality of column select lines; and a stress application circuit operating in a test mode to selectively apply a stress potential to predetermined ones of said plurality of column select lines.

2. The semiconductor memory device according to claim 1, wherein said stress application circuit includes:

a column select disable circuit operating in said test mode to disable an operation performed by said column select circuit to select said column select line;

a test potential generation circuit operating in said test mode to generate said stress potential applied to said column select line; and a potential supply circuit operating in said test mode to selectively supply said stress potential to said predetermined column select lines.

3. The semiconductor memory device according to claim 2, wherein:

said column select disable circuit includes a plurality of first switch circuits provided between said column select circuit and said plurality of column select lines and disconnected responsively when said test mode is designated;

said test potential generation circuit includes a first potential input pad for receiving a first test potential external to said semiconductor memory device, and a second potential input pad for receiving a second test potential external to said semiconductor memory device; and said potential supply circuit selectively supplies said first and second test potentials supplied through said first and second potential input pads to said predetermined column select lines.

4. The semiconductor memory device according to claim 3, wherein said potential supply circuit includes:

a first potential supply line for transmitting said first test potential from said first potential input pad;

a plurality of second switch circuits each provided between said first potential supply line and even-numbered ones of said plurality of column select lines and conducting responsively when said test mode is designated;

a second potential supply line for transmitting said second test potential from said second potential input pad; and a plurality of third switch circuits each provided between said second potential supply line and an odd-numbered one of said plurality of column select lines and conducting responsively when said test mode is designated.

5. The semiconductor memory device according to claim 2, further comprising a power supply line provided between at least two of said plurality of column select lines, wherein:

said column select disable circuit includes a plurality of first switch circuits provided between said column select circuit and said plurality of column select lines and disconnected responsively when said test mode is designated;

said test potential generation circuit includes a potential input pad for receiving a test potential external to said semiconductor memory device; and said potential supply circuit includes a potential supply line for transmitting said test potential from said potential input pad, and a plurality of second switch circuits provided between said potential supply line and said plurality of column select lines, respectively, and conducting responsively when said test mode is designated.

6. The semiconductor memory device according to claim 5, wherein:

said memory cell array is divided in a plurality of memory cell blocks; and said power supply line supplies said power supply potential commonly to said plurality of memory cell blocks.

7. The semiconductor memory device according to claim 2, wherein:

said test potential generation circuit includes a test mode decision circuit responsive to a control circuit applied external to said semiconductor memory device for detecting that said test mode is designated and for generating first and second test potentials;

said column select disable circuit includes a plurality of first switch circuits provided between said column select circuit and said plurality of column select lines and disconnected responsively when said test mode is designated; and said potential supply circuit selectively supplies to a predetermined one of said plurality of column select lines said first and second test potentials applied through said first and second potential input pads.

8. The semiconductor memory device according to claim 7, wherein said potential supply circuit includes:

a first potential supply line for transmitting said first test potential;

a plurality of second switch circuits each provided between said first potential supply line and an even-numbered one of said plurality of column select lines and conducting responsively when said test mode is designated;

a second potential supply line for transmitting said second test potential; and a plurality of third switch circuits each provided between said second potential supply line and an odd-numbered one of said plurality of column select lines and conducting responsively when said test mode is designated.

9. The semiconductor memory device according to claim 1, further comprising:

a first potential input pad for receiving a first indication signal external to said semiconductor memory device and transmitting said first indication signal to said potential supply circuit; and a second potential input pad for receiving a second indication signal external to said semiconductor memory device, wherein:

said column select circuit includes a column select disable circuit operating in said test mode to set as a predetermined potential a level of a column select signal each output from said column select circuit onto a respective one of said plurality of column select lines, for disabling an operation performed by said column select circuit to select said column select line;

said stress application circuit includes a potential supply circuit operating in said test mode to selectively supply said stress potential to predetermined ones of said plurality of column select lines; and said potential supply circuit has a plurality of first drive circuits provided for even-numbered ones of said plurality of column select lines, respectively, receiving a column select signal from said column select circuit and said first indication signal and responsive to said first indication signal being placed in an active state for setting as said stress potential a potential of said column select line corresponding thereto, and a plurality of said drive circuits provided for odd-numbered ones of said plurality of column select lines, respectively, receiving a column select signal from said column select circuit and said second indication signal and responsive to said second indication signal being placed in an active state for setting as said stress potential a potential of said column select line corresponding thereto.

\* \* \* \* \*